United States Patent [19]

Davis, Jr.

[11] Patent Number: 4,912,404
[45] Date of Patent: Mar. 27, 1990

[54] INSTRUMENT FOR TUNING AND TESTING RADIO FREQUENCY CIRCUITS

[75] Inventor: Donald J. Davis, Jr., Rocky Point, N.Y.

[73] Assignee: American Technical Ceramics Corporation, Huntington Station, N.Y.

[21] Appl. No.: 295,150

[22] Filed: Jan. 9, 1989

[51] Int. Cl.⁴ .................... G01R 31/02; H03J 1/06
[52] U.S. Cl. .................... 324/158 R; 334/89; 324/158 F; 324/158 P
[58] Field of Search ............ 324/158 F, 158 P, 95, 324/122, 158 R, 57 R, 72.5; 334/89; 455/67, 115, 226; 294/19.1, 19.2; 81/488, 900

[56] References Cited

U.S. PATENT DOCUMENTS

| | | | |
|---|---|---|---|
| 1,830,520 | 11/1931 | Moyses | 294/19.2 |
| 1,906,644 | 5/1933 | Sleeper | 324/122 |
| 3,328,690 | 6/1967 | Lockie et al. | 324/122 |

FOREIGN PATENT DOCUMENTS

| | | | |
|---|---|---|---|
| 207138 | 11/1923 | United Kingdom | 294/19.2 |
| 540068 | 10/1941 | United Kingdom | 324/122 |

*Primary Examiner*—Ernest F. Karlsen
*Attorney, Agent, or Firm*—Edward H. Loveman

[57] ABSTRACT

This instrument for use in tuning and testing radio frequency circuits, comprises an elongated dielectric rod long enough to be grasped by hand, and having a miniature electronic component at one end secured by an adhesive layer and a length of shrink-wrapped plastic tubing. Two closely spaced stiff leads project from the component for application to closely spaced test points of a radio frequency circuit under test. The component can comprise a miniature test circuit, interconnected miniature electronic parts of any type, a miniature capacitor alone, or a capacitor in circuit with other electronic circuit parts.

9 Claims, 1 Drawing Sheet

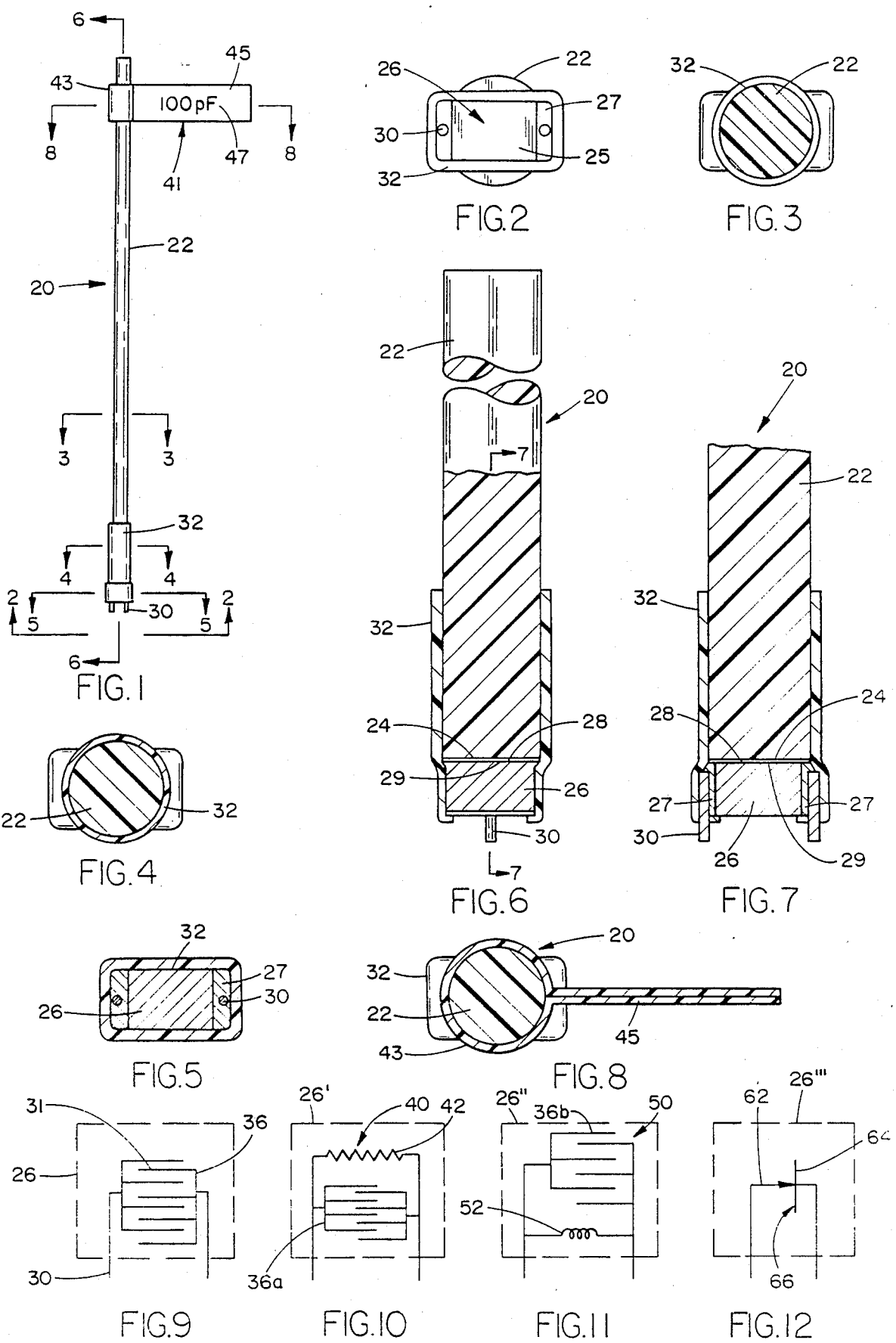

INSTRUMENT FOR TUNING AND TESTING RADIO FREQUENCY CIRCUITS

BACKGROUND OF THE INVENTION

1. Field of the Invention

This invention concerns an instrument for use in tuning, testing, adjusting and repairing miniature radio frequency circuits.

2. Description of the Prior Art

It is frequently necessary when tuning, testing, and adjusting miniature radio frequency circuits, to substitute or insert temporarily into the circuit one or more electronic or electric components such as capacitors, resistors, inductors, etc. of different sizes. Heretofore there has been no convenient way of doing this, because the electrical components are very small and are difficult to manipulate. The components have to be handled with insulated pliers or tweezers and this is very awkward, so tuning, testing and adjusting of circuits is slow and laborious. A need has long existed for a practical instrument to facilitate temporary insertion of a miniature electronic component into an R. F. circuit for test and adjustment purposes.

SUMMARY OF THE INVENTION

The present invention meets this long felt need by providing an instrument with a long dielectric, insulative handle one end of which is a small electrical or electronic component arranged so that its spaced leads project outwardly for ready insertion into a circuit to contact spaced test points. According to the invention, the instrument comprises a relatively long rod made of low-loss dielectric material. On one end of the rod is secured a miniature electrical or electronic component. The leads of the component are spaced a short distance apart just enough to bridge two spaced circuit points. In use, the effect caused by insertion of the electronic component into the circuit can be observed by a meter, oscilloscope, or other circuit monitoring device.

These and other objects and many of the attendant advantages of this invention will be readily appreciated as the same becomes better understood by reference to the following detailed description when considered in connection with the accompanying drawings in which:

BRIEF DESCRIPTION OF THE DRAWINGS

FIG. 1 is a side elevational view of an instrument embodying the invention;

FIG. 2 is an enlarged bottom plan view of the instrument of FIG. 1;

FIGS. 3, 4, 5, and 8 are enlarged cross sectional views taken along lines 3—3, 4—4, 5—5, 8—8 respectively of FIG. 1;

FIG. 6 is an enlarged longitudinal sectional view taken along line 6—6 of FIG. 1, a portion of the dielectric rod being omitted;

FIG. 7 is a fragmentary vertical sectional view taken along line 7—7 of FIG. 6; and FIGS. 8, 9, 10, 11 and 12 are diagrams showing various electrical or electronic components and combinations of components which may be employed in the circuit testing instrument.

Referring now to the drawings wherein like reference characters designate like or corresponding parts throughout, there is illustrated in FIGS. 1-7, a circuit tuning or testing instrument generally designated as reference numeral 20 having a relatively long cylindrical rod 22 which serves as a handle for manipulating the instrument. The rod 22 is preferably made of insulative low-loss dielectric material so as to have no electrical effect when employed adjacent to a miniature radio frequency circuit. At one end 24 of the rod 22 is a miniature electrical component 26 such as a capacitor which has an outer insulative surface 25 and a pair of conductive terminals 27. The component 26 has a flat upper side 29 which is secured to the end 24 of the rod 22 by a thin layer 28 of suitable glue or adhesive. Surrounding the component 26 and a lower portion of the rod 22 is a cylindrical sleeve 32 made of low-loss dielectric plastic tubing which is made of thermoplastic material and is shrink-wrapped in place to secure the component 26 to the rod 22. The tubing sleeve 32 supplements the adhesive layer 28 in holding the component 26 on the rod 22 and in addition can serve as a convenient finger grip during use of the instrument to effect precise placement of the instrument into a radio frequency circuit.

The component 26 has a pair of spaced stiff short leads 30 connected to the terminals 27 and projecting downwardly away from the capacitor 26 and the rod 22. This construction facilitates insertion of the two leads 27 across two closely spaced points, circuit terminals, component terminals, solder joints, eyelets, etc. of a miniature radio frequency circuit, while the user grasps the rod 22.

FIGS. 1 and 8 show a tab 41 secured to an upper portion of rod 22. This tab is made of stiff, pressure sensitive adhesive material encircling the rod to form a collar 43. Then the tab extends laterally in a plane parallel to the axis of rod 22 to form a stiff double layered strip 45. This tabe performs multiple functions. It acts as a convenient handle for lifting and manipulating the instrument 20. It also may carry an indicia 47 indicating the type and magnitude or value of the component 26. It further serves as a convenient means for filing in a container a multiplicity of instruments 20 having different sizes and values, so that the user may easily pick out the one instrument 20 desired for a particular test. The tab 41 also serves to prevent the round rod 22 from rolling on a flat surface away from a place where it may be set by the user.

FIG. 9 shows schematically a diagram of a miniature capacitor 36 with multiple layers or plates 31 which can serve as the electronic component 26 in the instrument 20. The instrument 20 can be made with capacitors of different sizes ranging for example from 0.1 PF to 1000 PF.

FIG. 10 shows a miniature test circuit arranged as an RC circuit 40 containing a capacitor 36a and a resistor 42, which can be used as electronic component 26' for the instrument 20.

FIG. 11 shows a miniature tuned parallel resonant test circuit 50 containing capacitor 36b and inductor 52 for use as component 26" in the instrument 20.

FIG. 12 shows a test component 26"' having two parts 62, 64 constituting a rectifier 66.

The components 26, 26', 26" and 26"' as well as other electronic test circuit components, which can be readily devised, will all be test circuits which are miniature in size, for example, about 0.125 inches long, 0.125 inches wide, and about 0.1 inches thick. The rod 22 may be about ⅛ of an inch in diameter and about four inches long. Instead of a round cylindrical rod, the rod 22 can be noncircular such as square or rectangular in cross section. For some applications this form may be desirable since the noncircular shape in cooperation with the tab 41 will prevent the instrument from rolling on a flat surface when not in use. Also a non-circular rod may in some instances be easier to grip with the fingers. All of the components of FIGS. 9-12 terminate in the short, stiff, spaced, conductive leads 30 used in probing an RF circuit under test.

It should be understood that the foregoing relates to only a limited number of embodiments of the invention, which have been by way of example only and that it is intended to cover all changes and modifications of the example of the invention herein chosen for the purposes of the disclosure, which do not constitute departures from the spirit and scope of the invention.

What is claimed is:

1. An instrument for tuning and testing a radio frequency circuit, said circuit having a pair of closely spaced test points, comprising:
   an elongated rod made of low-loss dielectric material;
   a miniature electronic component abutted to one end of said rod, said component having closely spaced leads projecting therefrom; and
   a length of dielectric, plastic tubing shrink-wrapped around said component and an adjacent portion of said rod and rigidly holding said component in place, so that said component can be applied to an adjacent pair of said test points of said circuit while said rod is grasped by said user for applying and removing component from said circuit.

2. An instrument as defined in claim 1, wherein said component has an external insulative surface containing electrically conductive portions of said component.

3. An instrument as defined in claim 2, further comprising a layer of adhesive bonding said casing to said end of said rod and supplementing said tubing in holding said component in place at said one end of said rod.

4. An instrument as defined in claim 3, wherein said rod and said component are each about one-eighth of an inch wide so that said leads can contact said closely spaced test points in said circuit.

5. An instrument as defined in claim 4, wherein said rod is long enough to be grasped by hand when said leads of said component are applied to said test points in said circuit.

6. An instrument as defined in claim 5, further comprising a tab secured around said rod to form a collar near the other end of said rod, said tab having a stiff double layered strip extending laterally of said rod in a plane parallel to the axis of said rod, for use in lifting and carrying said instrument, for preventing rolling of said rod on a flat surface, and for carrying indicia indicative of the type and size of said component on said rod.

7. An instrument as defined in claim 5, wherein said electrically conductive portions of said component are arranged to constitute a miniature capacitor operable at high radio frequencies.

8. An instrument as defined in claim 5, further comprising other electronic conducting parts in said casing connected to said capacitor and cooperating therewith in testing said circuit.

9. An instrument as defined in claim 5, wherein said electrically conductive portions of said component are arranged to constitute a miniature electronic test circuit.

* * * * *